US008219376B2

(12) United States Patent
Pidan et al.

(10) Patent No.: US 8,219,376 B2
(45) Date of Patent: Jul. 10, 2012

(54) VERIFICATION USING DIRECTIVES HAVING LOCAL VARIABLES

(75) Inventors: Dmitry Pidan, Haifa (IL); Sitvanit Ruah, Rehovot (IL)

(73) Assignee: International Business Machines Corporation, Armonk, NY (US)

( * ) Notice: Subject to any disclaimer, the term of this patent is extended or adjusted under 35 U.S.C. 154(b) by 760 days.

(21) Appl. No.: 12/037,956

(22) Filed: Feb. 27, 2008

(65) Prior Publication Data

US 2009/0216513 A1 Aug. 27, 2009

(51) Int. Cl.
G06F 17/50 (2006.01)
G06F 9/455 (2006.01)
G06F 11/00 (2006.01)
G06F 11/22 (2006.01)

(52) U.S. Cl. .............. 703/14; 703/15; 703/16; 714/37; 714/747; 714/49; 716/106; 716/107; 716/111; 716/136

(58) Field of Classification Search .............. 703/14–16; 714/37, 747, 49; 716/106, 107, 111, 136
See application file for complete search history.

(56) References Cited

U.S. PATENT DOCUMENTS

| 5,946,481 | A | * | 8/1999 | Kurshan et al. | 703/13 |
|---|---|---|---|---|---|
| 5,966,516 | A | * | 10/1999 | De Palma et al. | 703/1 |
| 6,099,575 | A | * | 8/2000 | Hardin et al. | 703/22 |
| 6,157,901 | A | * | 12/2000 | Howe | 703/2 |
| 6,185,516 | B1 | * | 2/2001 | Hardin et al. | 703/2 |
| 6,324,496 | B1 | * | 11/2001 | Alur et al. | 703/17 |
| 6,408,262 | B1 | * | 6/2002 | Leerberg et al. | 703/2 |
| 6,484,135 | B1 | * | 11/2002 | Chin et al. | 703/23 |
| 6,493,852 | B1 | * | 12/2002 | Narain et al. | 716/106 |
| 7,188,061 | B2 | | 3/2007 | Beer et al. | |
| 7,260,558 | B1 | * | 8/2007 | Cheng et al. | 706/12 |
| 7,313,772 | B2 | * | 12/2007 | Hekmatpour et al. | 716/5 |
| 7,386,813 | B2 | * | 6/2008 | Singh et al. | 716/3 |
| 7,478,028 | B2 | * | 1/2009 | Ho et al. | 703/14 |
| 7,493,247 | B2 | * | 2/2009 | Memmi | 703/14 |
| 7,596,770 | B1 | * | 9/2009 | Kuehlmann et al. | 716/106 |
| 7,711,536 | B2 | * | 5/2010 | McNamara | 703/14 |
| 7,900,173 | B1 | * | 3/2011 | Kuehlmann et al. | 716/107 |
| 8,015,521 | B2 | * | 9/2011 | Moon | 716/107 |
| 8,024,691 | B2 | * | 9/2011 | Zilic et al. | 716/132 |
| 2002/0002698 | A1 | * | 1/2002 | Hekmatpour | 716/4 |
| 2004/0117746 | A1 | * | 6/2004 | Narain et al. | 716/4 |
| 2005/0102596 | A1 | * | 5/2005 | Hekmatpour | 714/741 |
| 2006/0107141 | A1 | * | 5/2006 | Hekmatpour | 714/724 |
| 2006/0136879 | A1 | * | 6/2006 | Singh et al. | 717/136 |

(Continued)

OTHER PUBLICATIONS

Augmenting a Regular Expression-Based Temporal Logic with Local Variables; Cindy Eisner et al, pp. 1-8, IEEE 2008.*

(Continued)

*Primary Examiner* — Kamini S Shah
*Assistant Examiner* — Akash Saxena
(74) *Attorney, Agent, or Firm* — Daniel Klinger

(57) ABSTRACT

A computer-implemented method for verifying a design includes representing a verification directive, which pertains to the design and includes a local variable, by a finite state machine. The state machine includes multiple states, with transitions among the states, transition conditions associated with the transitions, and procedural blocks, which correspond to the transitions and define operations to be performed on the local variable when traversing the respective transitions. The finite state machine is executed by traversing the transitions in accordance with the respective transition conditions and modifying the local variable in accordance with the respective procedural blocks of the traversed transitions, so as to verify the design with respect to the verification directive.

18 Claims, 2 Drawing Sheets

U.S. PATENT DOCUMENTS

| | | | |
|---|---|---|---|
| 2006/0190239 A1* | 8/2006 | Piper et al. | 703/26 |
| 2007/0028203 A1* | 2/2007 | Sato et al. | 716/18 |
| 2007/0083352 A1* | 4/2007 | Raghavan et al. | 703/16 |
| 2007/0168894 A1* | 7/2007 | Iwashita | 716/4 |
| 2007/0179639 A1* | 8/2007 | Sakai | 700/29 |
| 2008/0082946 A1* | 4/2008 | Zilic et al. | 716/5 |
| 2008/0215925 A1* | 9/2008 | Degenaro et al. | 714/41 |
| 2009/0064064 A1* | 3/2009 | Eisner et al. | 716/5 |

OTHER PUBLICATIONS

High-level Symbolic Construction Techniques for High Performance Sequential Synthesis; Andrew Seawright et al; Annual ACM IEEE Design Automation Conference; Proceedings of the 30th international Design Automation Conference pp. 424-428; Year of Publication: 1993.*

Eisner, C.; Fisman, D.;, "Proposal for Extending Annex B of PSL with Local Variables, Proecedural Blocks, Past Expressions and Clock ALignment Operators" IBM Research report H-0256 Jan. 6, 2008 pp. 1-21.*

Eisner, C.; Fisman, D.;, "Augmenting a Regular Expression-Based Temporal Logic with Local Variables," Formal Methods in Computer-Aided Design, 2008. FMCAD '08, vol., no., pp. 1-8, Nov. 17-20, 2008 doi: 10.1109/FMCAD.2008.ECP.27.*

Dahan, A.; Geist, D.; Gluhovsky, L.; Pidan, D.; Shapir, G.; Wolfsthal, Y.; Benalycherif, L.; Kamidem, R.; Lahbib, Y.;, "Combining system level modeling with assertion based verification," Quality of Electronic Design, 2005. ISQED 2005. Sixth International Symposium on, vol., no., pp. 310-315, Mar. 21-23, 2005 doi: 10.1109/ISQED.2005.32.*

Bustan and Havlicek, "Some Complexity Results for SystemVerilog Assertions," Proceedings of the 18th International Conference on Computer Aided Verification (CAV), Seattle, Washington, Aug. 17-20, 2006, pp. 205-218.

Long and Seawright, "Synthesizing SVA Local Variables for Formal Verification," Proceedings of the 44th ACM/IEEE Design Automation Conference (DAC), San Diego, California, Jun. 4-8, 2007, pp. 75-80.

S. Ruah et al., "Automata Construction for On-The-Fly Model Checking PSL Safety Simple Subset," IBM Research Report H-0258, Jun. 2005, 22 pages.

S. Ben-David et al. "The Safety Simple Subset," Proceedings of the Haifa Verification Conference, Haifa, Israel, Nov. 13-16, 2005, pp. 1-16.

PSL is specified in "Standard for Property Specification Language (PSL)," IEEE standard 1850-2007, 2007, also known as IEC 62531:2007(E), Not provided. Available at IEEE.

SVA is specified in "IEEE Standard for SystemVerilog—Unified Hardware Design, Specification and Verification Language," IEEE Standard 1800-2005, 2005, Not provided. Available at IEEE.

* cited by examiner

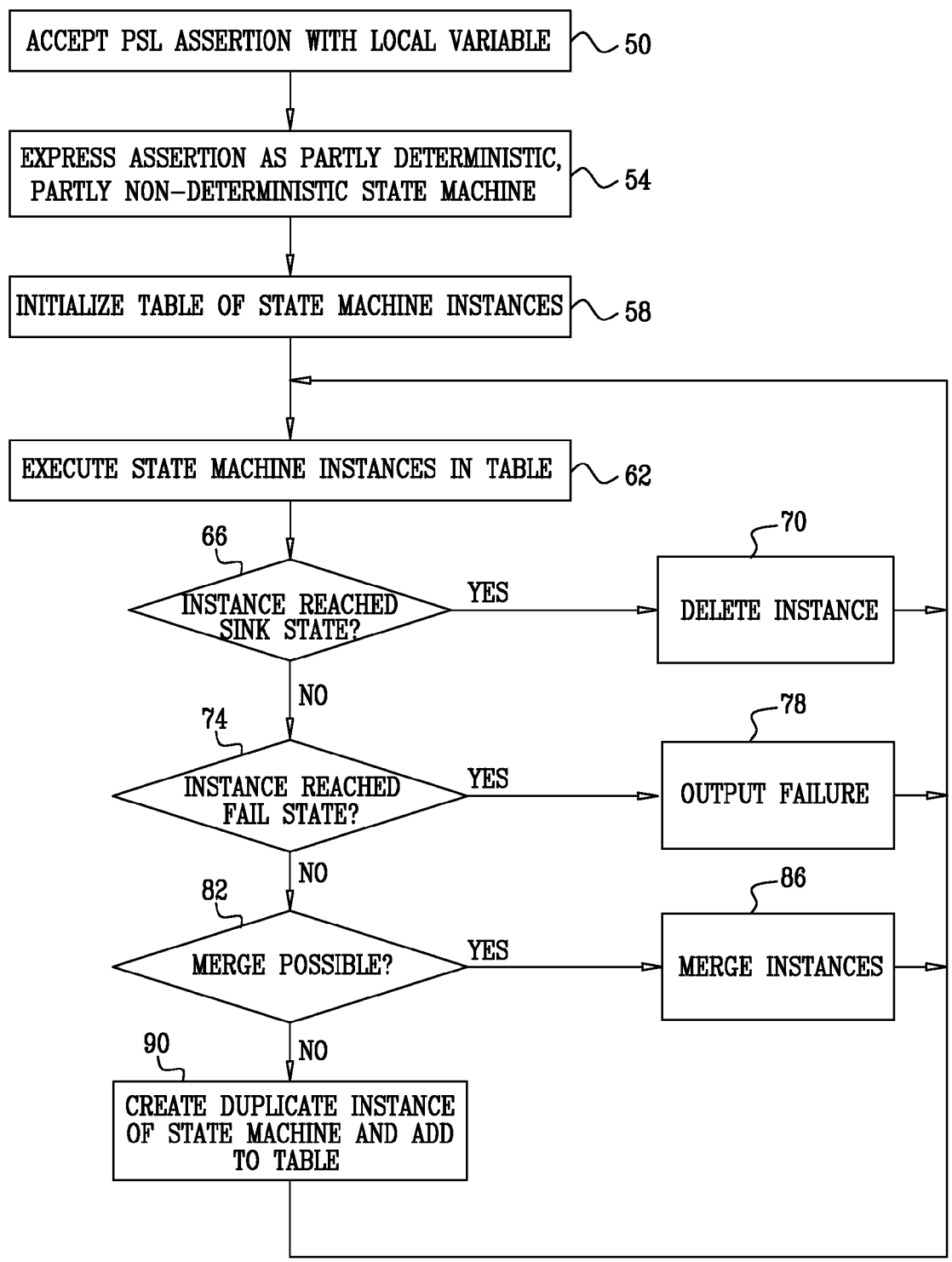

VERIFICATION USING DIRECTIVES HAVING LOCAL VARIABLES

FIELD OF THE INVENTION

The present invention relates generally to design verification, and particularly to methods and systems for executing verification directives that include local variables.

BACKGROUND OF THE INVENTION

Design verification systems perform the task of verifying that a given hardware design satisfies its specified requirements. Design verification is typically performed by a verification tool, which subjects the tested design to various test cases and scenarios. Various known verification methods can be used for this purpose, such as simulation-based methods and/or formal verification methods.

The verification process is sometimes carried out using a methodology referred to as Assertion-based Verification (ABV). In ABV, properties of the design are formulated as directives to the verification tool, such as assertions. Several standardized assertion languages are used for specifying assertions, such as the Property Specification Language (PSL) and the SystemVerilog® Assertions (SVA) language. PSL is specified in "Standard for Property Specification Language (PSL)," IEEE standard 1850-2007, 2007, also known as IEC 62531:2007(E). SVA is specified in "IEEE Standard for SystemVerilog—Unified Hardware Design, Specification and Verification Language," IEEE Standard 1800-2005, 2005.

Verification directives may include local variables that are used for tracking information during different stages of the verification process. Methods for processing assertions that include local variables are described, for example, by Bustan and Havlicek in "Some Complexity Results for SystemVerilog Assertions," Proceedings of the 18th International Conference on Computer Aided Verification (CAV), Seattle, Wash., Aug. 17-20, 2006, pages 205-218, and by Long and Seawright in "Synthesizing SVA Local Variables for Formal Verification," Proceedings of the 44th ACM/IEEE Design Automation Conference (DAC), San Diego, Calif., Jun. 4-8, 2007, pages 75-80.

Design properties are sometimes represented by finite automata, or state machines. Automata-based methods are described, for example, by Ben-David et al., in "Automata Construction for On-The-Fly Model Checking PSL Safety Simple Subset," IBM Research Report H-0258, June, 2005, and in "The Safety Simple Subset," Proceedings of the Haifa Verification Conference, Haifa, Israel, Nov. 13-16, 2005, pages 14-29.

As another example, U.S. Pat. No. 7,188,061 describes a method for design verification, which includes receiving a software model of a design of a system under evaluation, and providing a property, which is dependent on a specified variable having a predefined range of values. The property applies to all states of the system for any selected value among the values of the variable within the predefined range. The property is processed so as to generate a checker program for detecting a violation of the property. A simulation of the system is then run using the software model together with the checker program.

SUMMARY OF THE INVENTION

Embodiments of the present invention provide a computer-implemented method for verifying a design, including: representing a verification directive, which pertains to the design and includes a local variable, by a finite state machine including multiple states, with transitions among the states, transition conditions associated with the transitions, and procedural blocks, which correspond to the transitions and define operations to be performed on the local variable when traversing the respective transitions; and executing the finite state machine by traversing the transitions in accordance with the respective transition conditions and modifying the local variable in accordance with the respective procedural blocks of the traversed transitions, so as to verify the design with respect to the verification directive.

There is additionally provided, in accordance with an embodiment of the present invention, apparatus for verifying a design, including:

an interface, which is coupled to accept a verification directive, which pertains to the design and includes a local variable; and a processor, which is coupled to represent the verification directive by a finite state machine including multiple states, with transitions among the states, transition conditions associated with the transitions, and procedural blocks, which correspond to the transitions and define operations to be performed on the local variable when traversing the respective transitions, and to execute the finite state machine by traversing the transitions in accordance with the respective transition conditions and modifying the local variable in accordance with the respective procedural blocks of the traversed transitions, so as to verify the design with respect to the verification directive.

The present invention will be more fully understood from the following detailed description of the embodiments thereof, taken together with the drawings in which:

BRIEF DESCRIPTION OF THE DRAWINGS

FIG. 2 is a flow chart that schematically illustrates a method for verifying a property that is specified using a local variable, in accordance with an embodiment of the present invention.

DETAILED DESCRIPTION OF EMBODIMENTS

Overview

Figure 1:
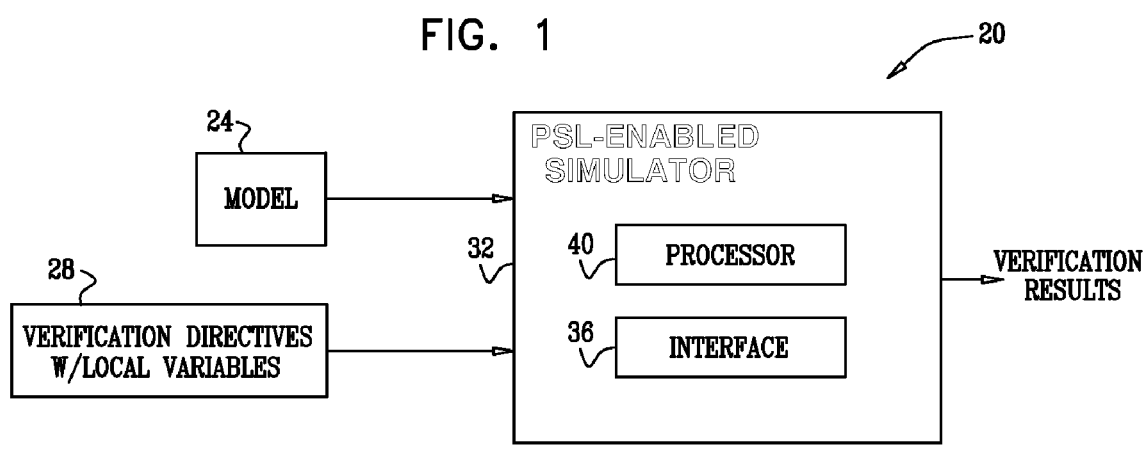
FIG. 1 is a block diagram that schematically illustrates a system for design verification, in accordance with an embodiment of the present invention.

Embodiments of the present invention provide improved methods and systems for executing verification directives that include local variables. In some embodiments, a verification tool accepts a Property Specification Language (PSL) directive, which pertains to a tested design and includes a local variable. Local variables are variables that are used by the verification tool for tracking information during the process of verifying a particular directive. A local variable is defined and valid only within the task of verifying the specific directive in which it is specified, and cannot be used, for example, for verifying other directives.

The verification tool represents the directive as a finite state machine (finite automaton), which comprises states and transitions between states. The tool then verifies the verification directive by executing the state machine. For example, when the state machine reaches a state that is defined as a fail state, the tool concludes that the directive is not met by the design.

The current value of the local variable may change during the verification process. Moreover, the verification process itself, as defined in the directive, may depend on the current value of the local variable. The methods and systems described herein enable the verification tool to modify local variable values during execution. For this purpose, each transition of the state machine may have an associated set of procedural blocks (also referred to as action blocks), which define operations to be performed on the local variable when the transition is taken. When traversing a certain transition, the verification tool modifies the value of the local variable in accordance with the procedural blocks of the traversed transition. Thus, the local variable is modified as the execution of the state machine progresses.

Typically, the state machine that represents the verification directive is partly deterministic and partly non-deterministic. In other words, some of the states may have multiple possible outgoing transitions. In some embodiments, the verification tool executes multiple copies of the state machine concurrently. Each copy is identified by a value of the local variable and by a set of states that are reachable in the current execution cycle. The verification tool adds, deletes and/or merges copies of the state machine during execution, as appropriate.

The methods and systems described herein enable efficient execution of verification directives that include local variables. Unlike some known execution methods, which create deterministic states that account for every possible value of the local variable, the methods and systems described herein modify the value of the variable dynamically as the execution progresses. Therefore, the methods and systems described herein are suitable for local variables having large ranges of values, including variables defined over infinite ranges.

Although the embodiments described herein refer mainly to hardware design verification, the methods and systems described herein can also be used for verifying software using directives that include local variables.

System Description

FIG. 1 is a block diagram that schematically illustrates a system 20 for design verification, in accordance with an embodiment of the present invention. The design to be verified is typically specified in a specification document. The design specification is the basis for deriving a model 24 of the design, and of verification directives 28 that are used for verifying the design. Model 24 is typically written in a Hardware Description Language (HDL), such as Very High Speed Integrated Circuit Hardware Description Language (VHDL) or Verilog. Some of the verification directives may test properties that the tested design should meet. The directives can be written in PSL, as in the present example, or in any other specification language such as SVA. The verification directives may include local variables.

System 20 comprises a verification tool, such as a PSL-enabled simulator 32. The simulator simulates the operation of the tested design, as represented by the model derived from the design specification, and verifies the design against the properties.

The PSL-enabled simulator accepts verification directives 28 as input. The directives may comprise assertions, which instruct the simulator to verify certain properties on the tested design. The directives may also comprise a "cover" directive, which instructs the simulator to check whether a given temporal sequence of conditions is observed during the verification run. Sequences are commonly specified using Sequential Extended Regular Expressions (SEREs), as are known in the art. Further alternatively, the simulator may process any other suitable type of verification directive. The simulator produces verification results, which indicate whether the design meets or violates the specified properties.

The verification results are presented to the user. The presented results may comprise an indication of whether or not the design meets the directive, a fault indication, and/or any other suitable information related to the verification task. For example, the verification tool may store certain parameter values of the design at the time a fault is detected, and present these values to the user for debugging. In some embodiments, the user debugs or otherwise modifies the design based on the verification results.

Simulator 32 comprises an interface 36 for accepting the model and directives and for producing the verification results, and a processor 40, which carries out the verification methods described herein. Typically, processor 40 comprises a general-purpose computer, which is programmed in software to carry out the functions described herein. The software may be downloaded to the computer in electronic form, over a network, for example, or it may alternatively be supplied to the computer on tangible media, such as CD-ROM.

In the embodiments described herein, the disclosed methods and systems are embodied in a PSL-enabled simulator. Alternatively, the methods and systems described herein can be embodied in other systems, such as in an automatic translation tool that translates PSL directives having local variables to a hardware description language used by the simulator (e.g., VHDL or Verilog).

Directives Having Local Variables

Verification directives are sometimes formulated using local variables. For example, a certain directive may request that a variable value be stored at a certain time, and then read and used at a later time. As another example, local variables can be used to store certain parameter values at different stages of the verification process, so that these values can be retrieved for debugging when the verification tool determines that a certain directive fails.

Embodiments of the present invention provide improved methods and systems for executing verification directives that include local variables. In the embodiments that are described herein, processor 40 of simulator 32 represents each directive as a finite automaton, i.e., as a finite state machine. The description that follows refers to a single verification directive having a single local variable for the sake of clarity, but the method can similarly be used with multiple directives and/or directives comprising multiple local variables.

The state machine constructed by processor 40 comprises a number of states, and transitions among the states. Each transition has a source state, a destination state and a transition condition. Each transition condition typically comprises a Boolean expression over a set of Boolean variables related to the design. A transition may be taken only if the corresponding transition condition evaluates to true. In some cases, a transition condition may depend on the local variable.

Generally, a certain state in the state machine may be a source state of more than one possible transition. In other words, when the state machine execution reaches this state, more than one possible transition may be taken. Such a state is referred to as a non-deterministic state. A state machine comprising at least one non-deterministic state is referred to as a non-deterministic state machine. Typically, state machines representing verification directives are partly deterministic and partly non-deterministic, i.e., a combination of a Deterministic Finite Automaton (DFA) and a Non-deterministic Finite Automaton (NFA). (Note that a state comprising transitions having mutually-exclusive transition conditions is not regarded as a non-deterministic state, since only one of the transitions may be taken at any point in time.)

A transition may also have an associated (possibly empty) set of procedural blocks, which defines operations that are to be performed on the local variable when the transition is taken. Thus, when simulator 32 executes the state machine, a certain sequence of transitions is traversed. The value of the local variable changes with each traversed transition in accordance with the procedural blocks associated with the transition.

One or more of the states are defined as initial states, from which execution may begin. One or more states are defined as fail states. The execution of the state machine reaches a fail state when the directive is not met (e.g., a specified property is violated or a specified sequence is found). The state machine may also have one or more sink states, i.e., states that have only incoming transitions and no outgoing transitions to other states.

For a given directive, processor 40 maintains and executes multiple instances of the state machine concurrently. At any given time, each table entry (instance) holds a current value of the local variable and a set of copies of the state machine, with each copy having a certain marked set of active states, i.e., states that are reachable in the current execution cycle. In other words, each copy of the state machine is identified by a value of the local variable and by a set of active states. The processor may duplicate, merge and/or delete certain instances at run-time, as will be explained below.

Initially, the instance table holds a single instance having the initial value of the local variable and the set of initial states of the state machine. After each execution cycle, processor 40 adds to the table instances, whose states are reachable by one transition from the instances of the previous cycle. For each instance, a new value of the local variable is calculated by applying the procedural blocks, which are associated with the transitions applied to this instance, to the value of the local variable calculated at the previous cycle. The states that are reachable at a given execution cycle are referred to as active states.

The processor verifies the directive by concurrently executing the multiple instances. The verification results can be produced in a number of ways. For example, when a certain instance reaches a fail state, the simulator declares that the directive was not met. The simulator may declare that the verification succeeded when all instances have reached a sink state, or after performing a certain maximum number of transitions without reaching a fail state by any of the instances.

FIG. 2 is a flow chart that schematically illustrates a method for verifying a property that is specified using a local variable, in accordance with an embodiment of the present invention. The method begins with processor 40 of simulator 32 accepting a PSL assertion that includes a local variable, at an assertion input step 50.

Processor 40 represents the PSL assertion as a finite state machine, at a representation step 54. Methods for representing assertions as state machines are described, for example, in the articles by Ben-David et al., cited above. Typically, some of the states of the state machine are deterministic and others are non-deterministic. The processor initializes the instance table, at an initialization step 58. At this stage, the table holds a single instance, which has the initial value of the local variable and the set of initial states of the state machine.

Processor 40 executes the state machine instances in the table, at an execution step 62. For each instance of the state machine, the processor evaluates the transition conditions of the outgoing transitions that exit the active states of all copies belonging to the instance. Transitions whose conditions are evaluated to true are referred to as applicable transitions. For each applicable transition, the processor carries out the operations defined in the procedural blocks of the transition, so as to compute a new value of the local variable. Processor 40 performs the applicable transitions of all instances, so as to determine an updated set of active states.

The processor checks whether any instance has reached a sink state in the present execution cycle, at a sink checking step 66. If a sink state was reached, the processor removes the instance from the table, at an instance deletion step 70. The method then loops back to execution step 62 above for performing the next execution cycle.

The processor checks whether any instance has reached a fail state in the present execution cycle, at a failure checking step 74. If a fail state was reached, the processor outputs a failure indication, at a failure notification step 78. The method loops back to execution step 62 above.

The processor checks whether it is possible to merge an instance with one of the instances existing currently in the table, at a merge checking step 82. Merging of two instances is possible if the following two conditions hold:

(1) The two instances have the same value of the local variable.
(2) For each copy of the state machine in the instance, either (a) The active states are all non-deterministic in one of the instances, or (b) in both instances, the state machine has the same deterministic state.

In other words, only instances associated with the same value of the local variable can be merged. The second condition is checked for every copy of the state machine in the instance. If the second condition holds for a particular copy, processor 40 creates a new copy of the state machine, which comprises a union of the two original copies. The original copies are removed from the instance. If the instance for which the first condition holds does not contain any copy for which the second condition holds, a new copy is added to this instance.

If merging is possible, i.e. the first condition holds, the processor merges the two instances as described in previous paragraph, at a merging step 86. Otherwise, the processor stores the new instance as an additional instance in the table. The method returns to execution step 62 above.

Formal Method Description

The PSL property can be represented as a partly deterministic (DFA) and partly non-deterministic (NFA) state machine by rewriting the property in the form $\{r\} \rightarrow \phi$, wherein r denotes a regular expression and $\phi$ denotes a PSL formula. This type of formula is commonly known as a suffix implication formula. Any suitable rules can be used for this purpose. Several examples are given in the articles by Ben-David et al., cited above, and by Beer et al., in "On-The-Fly Model Checking of RCTL Formulas," Proceedings of the $10^{th}$ International Conference on Computer Aided Verification (CAV), Vancouver, Canada, Jun. 28-Jul. 2, 1998, pages 184-194, which is incorporated herein by reference.

Let N denote the NFA for $\{r_1\} \rightarrow \phi$, which is obtained by concatenating an NFA for $r_1$ with a DFA for $\phi$. The nodes (states) of N are denoted $q, q_i, q_j, \ldots$. Let LHS denote the set of states in N belonging to the NFA of $r_1$. Let RHS denote the set of states in N belonging to the DFA of $\phi$. Let $\sigma, \sigma_1, \sigma_2, \ldots$ denote Boolean expressions. Let $A, A_i, A_j, \ldots$ denote (possibly empty) sets of procedural blocks.

Let tr, tr', tr", ... denote transitions in the NFA. Transition tr is represented by a tuple $<q_s, \sigma, A, q_d>$, wherein $q_s$ denotes the source state, $\sigma$ denotes the associated transition condition, A denotes the set of procedural blocks triggered by the transition, and $q_d$ denotes the destination state.

Let $lv$, $lv_1$, $lv_2$, ... denote values of the local variable. Let $Q$, $Q_i$, $Q_j$, ... denote sets of states in the NFA. Let TR, TR', TR", ... denote sets of transitions in N. Let I, I', I", ... denote instances of N. Instance I is represented by a pair <lv, Nodes>, wherein lv is a value of the local variable and Nodes is a (possibly empty) set of node pairs $\{<Q_1,Q_{R_1}>,<Q_2,Q_{R_2}>, \ldots ,<Q_n,Q_{R_n}>\}$, such that for any $i \leq n$, $Q_i$ is a set of states of N and $Q_{R_i} \subset$ RHS. Size (I) denotes the number of node pairs in Nodes of I. Let Inst, Inst' denote sets of instances. Let Out(Q) denote the set of transitions applicable from states of Q in a given execution cycle—an assignment to the variables in Boolean expressions. Let A(lv) denote the value produced by applying procedural block A to the local variable value lv.

The merging of an instance I into a set of instances I' is described by the following pseudo-code:

```
procedure merge(instance I, set_of_instances Inst')
    new=true
    foreach I' in Inst' do
        if I.lv=I'.lv then
            new=false
            foreach i in 0...size(I) do
                Denote I.Nodes[i]=(Q_i,Q_R_i)
                merged=false
                foreach j in 0...size(I') do
                    Denote I.Nodes[j]=(Q_j,Q_R_j)
                    if Q_R_i=Ø or Q_R_j=Ø or Q_R_i=Q_R_j then
                        Q_j=Q_i∪Q_j
                        Q_R_j=Q_R_j∪Q_R_i
                        merged=true
                    end if
                end do
                if merged=false then
                    I'.Nodes=I'.Nodes∪{(Q_i,Q_R_i)}
                end if
            end do
        end do
        if new=true then
            Inst'=Inst' ∪{I}
        end if
    end procedure
```

The main execution flow is described by the following pseudo-code:

Input:
(1) NdetSat—connected NFA, given as a set of transitions.
(2) Init—the set of initial states of the NFA.
(3) $Init_R$—the set of RHS DFA initial states that are also in Init.
(4) $lv_0$—the initial value of the local variable.

```
if Init does not contain states from RHS∩LHS
    Inst={<lv_0,<Init,Ø>>}
else
    Inst={<lv_0,<Init,Init_R>>}
end if
foreach cycle do
    Inst'=Ø
    foreach I in Inst do
        foreach i in 0...size(I) do
            Denote I.Nodes[i]=(Q_i,Q_R_i)
            foreach tr in Out(Q_i), tr.q_s∈LHS\RHS do
                if tr.q_d∉RHS∩LHS then
                    merge(<tr.A(lv),{<{tr.q_d},Ø>}>,Inst')
                else
                    merge(<tr.A(lv),{<{tr.q_d},{tr.q_d}>}>,Inst')
                end if
            end do
            foreach tr in Out(Q_R_i) do
                merge(<tr.A(lv),{<{tr.q_d},{tr.q_d}>}>,Inst')
            end do
        end do
    end do
    Inst=Inst'
end do
```

Although the embodiments described herein mainly address PSL assertions, the principles of the present invention can also be used for executing assertions and directives in other specification languages and standards, such as SVA. Although the embodiments described herein refer mainly to hardware design verification, the methods and systems described herein can also be used for verifying software, as well. Thus, in the context of the present patent application and in the claims, the term "design" refers to both hardware and software designs.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A computer-implemented method for verifying a design, comprising:
   representing a verification directive, which pertains to the design and includes a local variable, by a finite state machine comprising multiple states, with transitions among the states, transition conditions associated with the transitions, and procedural blocks, which correspond to the transitions and define operations to be performed on the local variable when traversing the respective transitions;
   for each of a plurality of values of the local variable occurring at run-time, defining a respective copy of the finite state machine, thereby maintaining multiple copies of the finite state machine, such that at any given time during the run-time, each of the copies is defined by a respective value of the local variable and a respective subset of the states that are currently reachable by the copy;
   executing the verification directive by concurrently traversing the transitions of the multiple copies of the finite state machine in accordance with the respective transition conditions and modifying the local variable in each of the copies in accordance with the respective procedural blocks at each of the traversed transitions, so as to produce verification results; and
   verifying the design with respect to the verification directive based on the verification results.

2. The method according to claim 1, wherein the verification directive is written in a Property Specification Language (PSL).

3. The method according to claim 1, wherein the verification directive comprises one of an assertion for verifying whether the design meets a given property, and a coverage directive for verifying whether the design exhibits a given temporal sequence of conditions.

4. The method according to claim 1, wherein maintaining the copies comprises merging first and second copies of the state machine having identical values of the local variable.

5. The method according to claim 4, wherein merging the copies comprises merging the first and second copies responsively to the copies meeting at least one condition selected from a group of conditions consisting of:
the first or second copies are identified by only non-deterministic states; and
the first and second copies are identified by identical deterministic states.

6. The method according to claim 5, wherein maintaining the copies comprises adding a new copy to the multiple copies upon determining that the first and second copies do not have the identical values of the local variable, or upon determining that the first and second copies are not identified by the identical deterministic states.

7. The method according to claim 1, wherein at least one of the states comprises a fail state, and wherein maintaining the copies comprises outputting a fault indication responsively to at least one of the copies of the state machine reaching the fail state.

8. The method according to claim 1, wherein at least one of the states comprises a sink state having no outgoing transitions, and wherein maintaining the copies comprises detecting that a given copy of the state machine reached the sink state, and removing the given copy from the multiple copies.

9. The method according to claim 1, and comprising presenting the verification results indicating a fault in the design to a user responsively to executing the multiple copies of the finite state machine, and debugging the fault based on the verification results.

10. Apparatus for verifying a design, comprising:
an interface, which is configured to accept a verification directive, which pertains to the design and includes a local variable; and
a processor, which is configured to represent the verification directive as a finite state machine comprising multiple states, with transitions among the states, transition conditions associated with the transitions, and procedural blocks, which correspond to the transitions and define operations to be performed on the local variable when traversing the respective transitions, and
wherein the processor is configured to define, for each of a plurality of values of the local variable occurring at run-time, a respective copy of the finite state machine, so as to maintain multiple copies of the finite state machine, such that at any given time during the run-time, each of the copies is defined by a respective value of the local variable and a respective subset of the states that are currently reachable by the copy, to execute the verification directive by concurrently traversing the transitions of the multiple copies of the finite state machine in accordance with the respective transition conditions and modifying the local variable in each of the copies in accordance with the respective procedural blocks of the traversed transitions, so as to produce verification results, and to verify the design with respect to the verification directive based on the verification results.

11. The apparatus according to claim 10, wherein the verification directive is written in a Property Specification Language (PSL).

12. The apparatus according to claim 10, wherein the verification directive comprises one of an assertion for verifying whether the design meets a given property, and a coverage directive for verifying whether the design exhibits a given temporal sequence of conditions.

13. The apparatus according to claim 10, wherein the processor is configured to merge first and second copies of the state machine having identical values of the local variable.

14. The apparatus according to claim 13, wherein the processor is configured to merge the first and second copies responsively to the copies meeting at least one condition selected from a group of conditions consisting of:
the first or second copies are identified by only non-deterministic states; and
the first and second copies are identified by identical deterministic states.

15. The apparatus according to claim 14, wherein the processor is configured to add a new copy to the multiple copies upon determining that the first and second copies do not have the identical values of the local variable, or upon determining that the first and second copies are not identified by the identical deterministic states.

16. The apparatus according to claim 10, wherein at least one of the states comprises a fail state, and wherein the processor is configured to output a fault indication responsively to at least one of the executed copies of the state machine reaching the fail state.

17. The apparatus according to claim 10, wherein at least one of the states comprises a sink state having no outgoing transitions, and wherein the processor is configured to detect that a given copy of the state machine reached the sink state, and to remove the given copy from the multiple copies.

18. The apparatus according to claim 10, wherein the processor is further configured to present a verification result indicating a fault in the design to a user responsively to executing the multiple copies of the finite state machine.

* * * * *